(12) United States Patent
McQueen et al.

(10) Patent No.: US 10,770,265 B1
(45) Date of Patent: Sep. 8, 2020

(54) SYSTEM AND METHOD FOR PREPARING CRYO-EM GRIDS

(71) Applicant: Neptune Fluid Flow Systems LLC, Palo Alto, CA (US)

(72) Inventors: Trevor Allen McQueen, Farragut, TN (US); Winnie Liang, Farragut, TN (US)

(73) Assignee: Neptune Fluid Flow Systems LLC, Palo Alto, CA (US)

( * ) Notice: Subject to any disclaimer, the term of this patent is extended or adjusted under 35 U.S.C. 154(b) by 0 days.

(21) Appl. No.: 16/823,506

(22) Filed: Mar. 19, 2020

Related U.S. Application Data

(60) Provisional application No. 62/821,857, filed on Mar. 21, 2019.

(51) Int. Cl.
*H01J 37/26* (2006.01)
*H01J 37/28* (2006.01)
*G01N 23/06* (2018.01)

(52) U.S. Cl.
CPC ............ *H01J 37/261* (2013.01); *G01N 23/06* (2013.01); *G01N 2223/3103* (2013.01)

(58) Field of Classification Search
CPC .......... H01J 37/261; H01J 37/26; H01J 37/28; G01N 23/06; G01N 2223/3103
USPC ........... 250/306, 307, 309, 310, 311, 440.11, 250/441.11, 442.11, 443.1
See application file for complete search history.

(56) References Cited

U.S. PATENT DOCUMENTS

| | | | | |
|---|---|---|---|---|
| 4,807,442 A | * | 2/1989 | Linner | B01D 8/00 118/50.1 |
| 5,364,756 A | * | 11/1994 | Livesey | A01N 1/02 435/2 |
| 5,493,865 A | * | 2/1996 | Wohlwend | G01N 1/42 62/51.1 |
| 2005/0056784 A1 | * | 3/2005 | Subramaniam | G01N 23/2251 250/311 |
| 2014/0360286 A1 | * | 12/2014 | Carragher | H01J 37/261 73/863.11 |
| 2020/0064241 A1 | * | 2/2020 | Meyerson | G01N 1/42 |

* cited by examiner

*Primary Examiner* — Nicole M Ippolito
(74) *Attorney, Agent, or Firm* — Chambliss, Bahner & Stophel, P.C.; Stephen D. Adams

(57) ABSTRACT

An electron microscope (EM) preparation and imaging system including an EM device and a sample preparation device for forming a vitreous ice layer containing a liquid sample through vitrification, which are located within a sealable environment. The sample preparation apparatus includes a cryogenically-cooled stage that receives a sample deposit surface, such as a cryo-EM grid, which is cryogenically cooled through direct contact with the stage. A sample dispenser is movable with respect to the stage and is configured to deposit a liquid sample onto the sample deposit surface at a selected rate of deposition. Once the liquid sample is deposited onto the sample deposit surface by the sample dispenser, it is vitrified automatically in place.

20 Claims, 6 Drawing Sheets

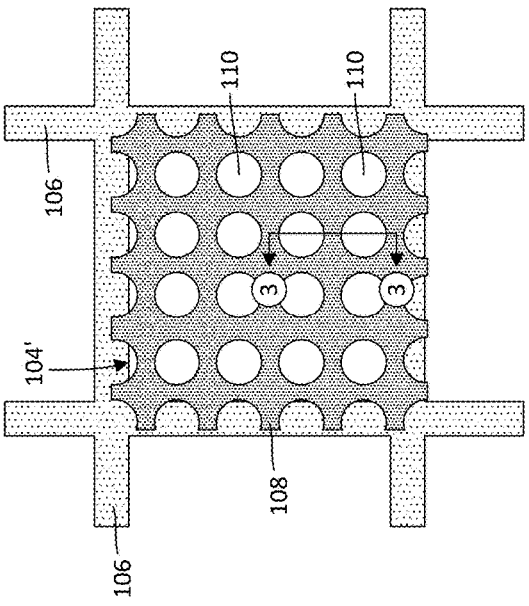
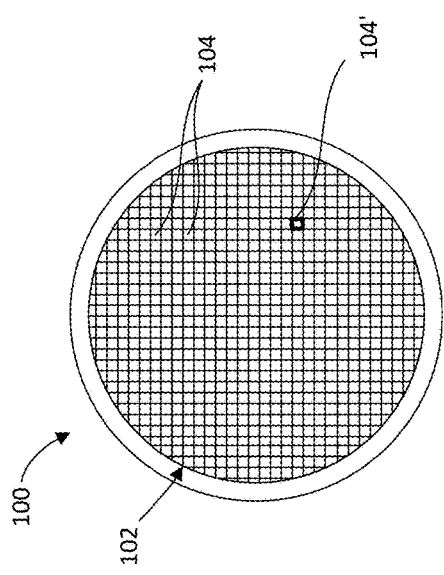
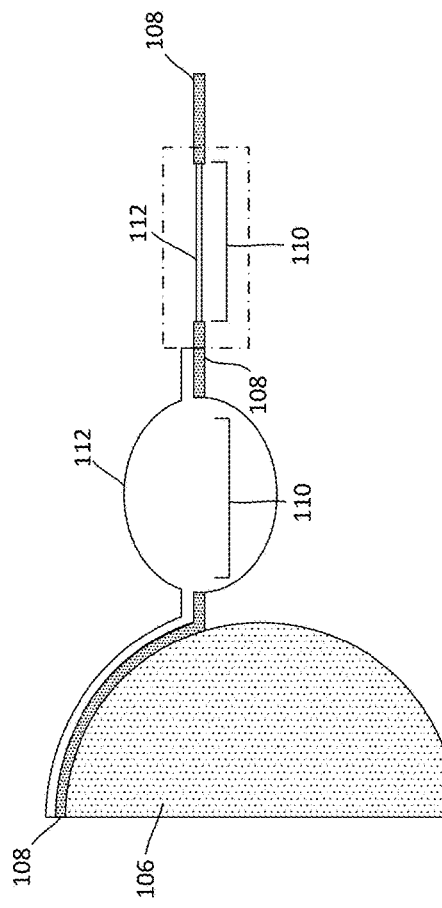

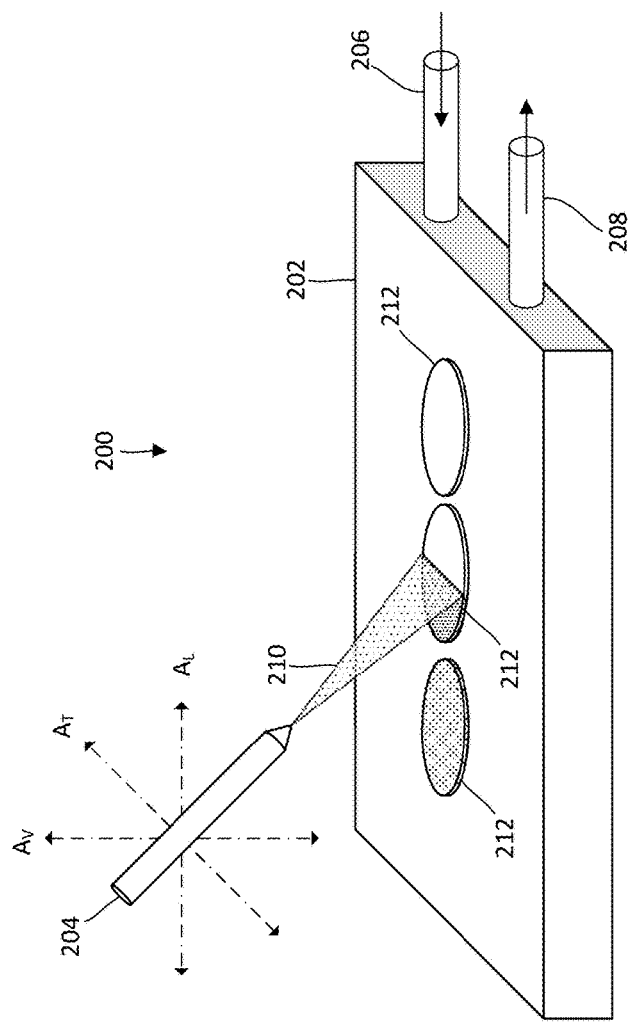
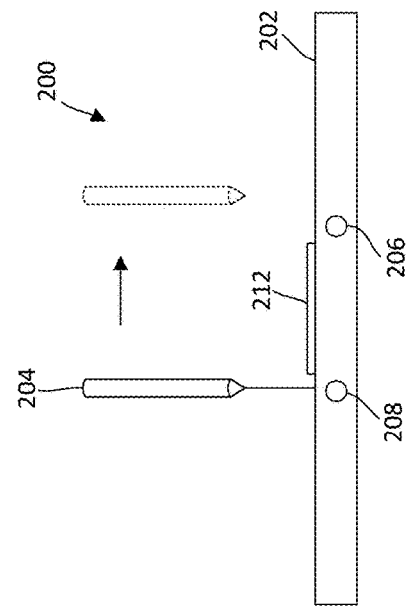
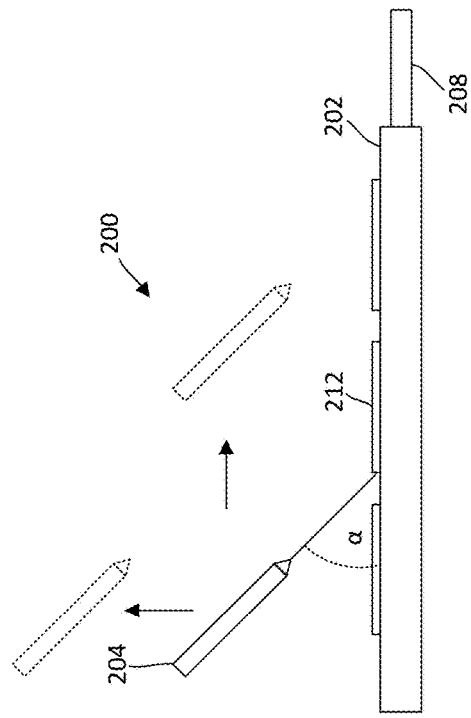

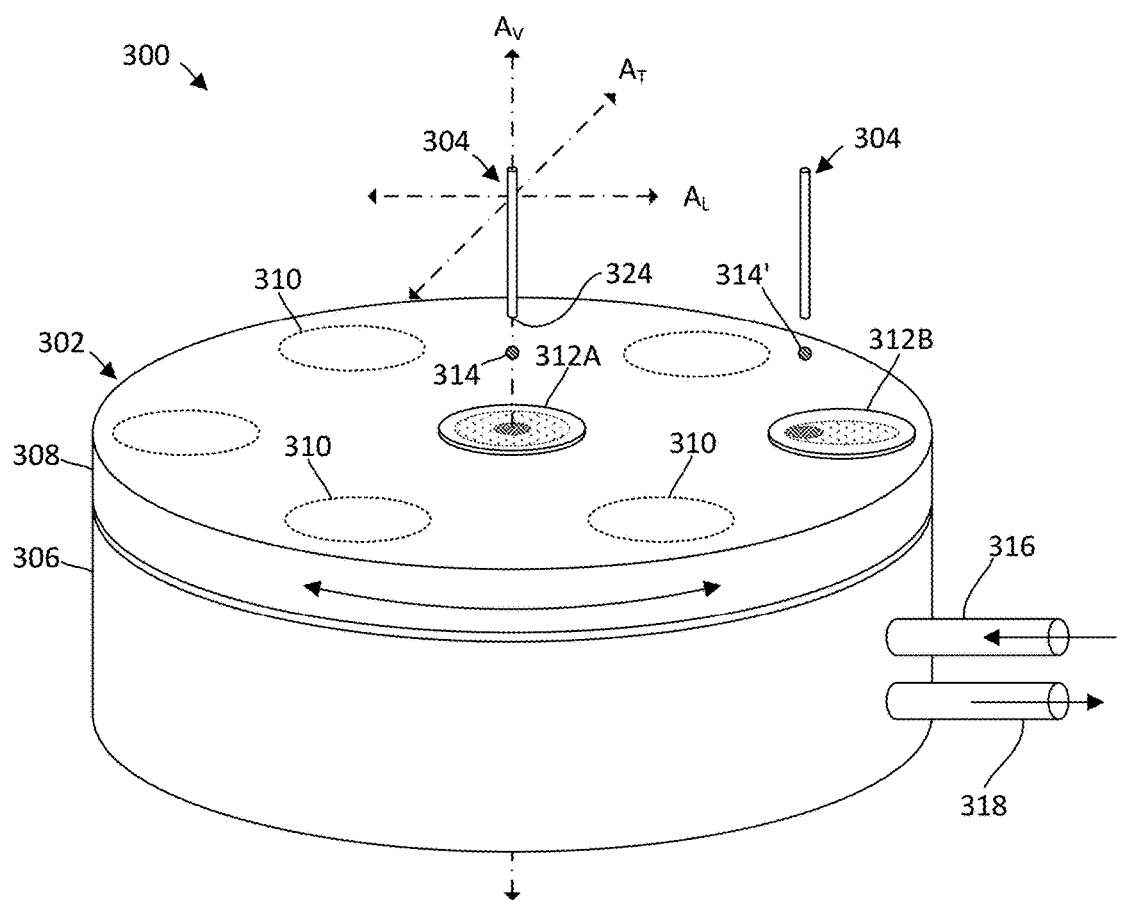
FIGURE 13
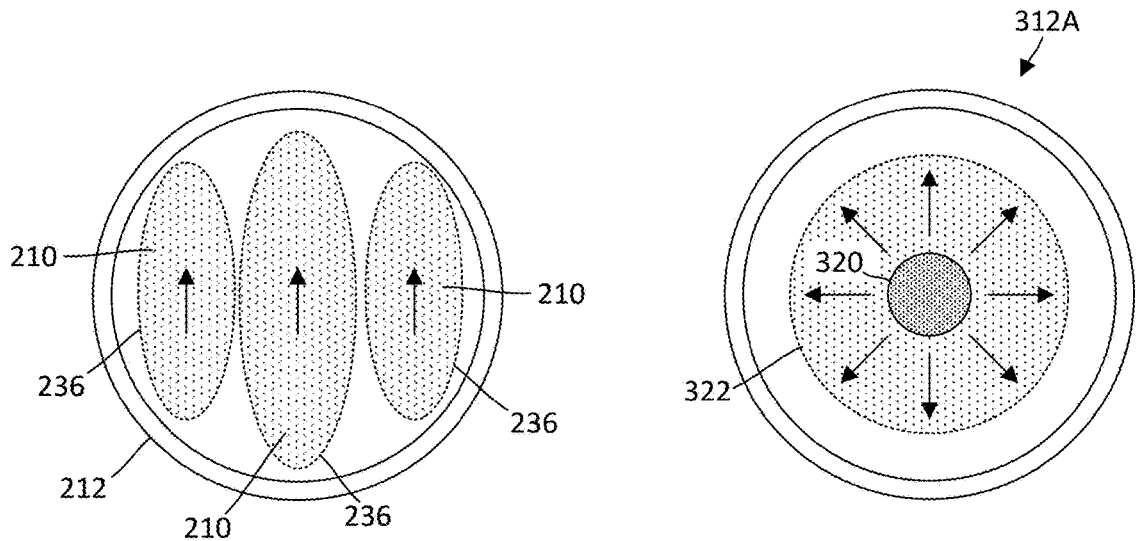
FIGURE 12  FIGURE 14

SYSTEM AND METHOD FOR PREPARING CRYO-EM GRIDS

CROSS-REFERENCE TO RELATED APPLICATION

This application claims the benefit of U.S. Provisional Patent Application No. 62/821,857, filed on Mar. 21, 2019 and entitled NOVEL DEVICE AND METHOD FOR PREPARING CRYOEM GRIDS WITH HIGH RELIABILITY, REPEATABILITY AND REPRODUCIBILITY, which is incorporated herein by reference in its entirety.

TECHNICAL FIELD

This invention relates generally to electron microscopy. More particularly, the invention relates to a method and apparatus for depositing and vitrifying liquid samples for use in electron microscopy.

BACKGROUND OF THE INVENTION

Part of the research and development cycle of pharmaceuticals is determining how an experimental drug interacts with the body. This is a critical step in learning not only if the pharmaceutical is effective for its intended purpose but also what other unintended side effects it may cause. One way for identifying the effects of a new pharmaceutical is to conduct laboratory experiments that expose the pharmaceutical to biological samples (e.g., proteins) and then observing the results of that interaction. Among other things that may be observed during these experiments, the shape of the sample may change and these changes in shape can provide an indication of the effects that the pharmaceutical would have on a body. In other words, these structural characterization studies show the site and strength of drug molecule binding. To ensure that the results of these tests are accurate, it is important to begin the experiment with a biological sample that is as close to its natural state and shape as possible with high structural and functional integrity. If the shape of a biological sample is altered or damaged before a test is conducted, the results of the test may not accurately reflect how the pharmaceutical being tested would affect the body in real life. Similar arguments are also valid in other fields such as materials science that involve looking at component interactions in the liquid state.

Cryogenic electron microscopy (cryo-EM) is an electron microscopy technique involving the imaging of biological materials in a transmission electron microscope under cryogenic conditions. In cryo-EM, high-voltage electrons are generated in a vacuum by an electron source (i.e., an electron gun). Those electrons are focused into a fine beam and are then directed towards and through a sample located on a movable stage. After passing through the sample, the electrons either scatter or hit an image recording system that includes an electron detector to generate an image. However, before any imaging or analysis can occur in the cryo-EM process, the samples must be prepared. During the sample preparation stage, sample proteins in an aqueous environment are captured in a thin layer of vitreous ice by being cooled very quickly (generally, in less than a millisecond) to cryogenic temperatures. When samples are prepared properly, the vitreous ice layer can trap biological matter in its natural form and provides a thin (generally, less than 3 micrometers thick), clear sample that is well suited for cryo-EM imaging and analysis. Cryo-EM may also be used in other scientific fields, including materials science, nanomedicine, and renewable energy.

Thus, sample preparation is a very important step in cryo-EM analyses. However, sample preparation is often complex, difficult, and costly. One common issue is the inability to reliably and precisely control the thickness of the vitreous ice formed when preparing a sample on a cryo-EM grid. Since electrons must transmit through an EM sample for an image to be formed, it is necessary that the sample be thin enough to transmit sufficient electrons to form an image with minimum energy loss and a high enough signal-to-noise ratio. On the other hand, if the sample is too thin, the sample may not be fully encapsulated by the vitreous ice layer and may extend through and become exposed at the water-air interface, which can cause their shape or composition to be adversely impacted. Proteins can aggregate and become grouped too closely together if the ice layer is too thin, or they may become disassociated (i.e., torn apart) or spread too far apart from or stack on top of one another if the ice layer is too thick. Other issues, such as the formation of ice artifacts and crystallization within the ice that cloud the ice, can make obtaining an image difficult or impossible. Therefore, carefully forming the vitreous ice layer with a particular thickness and clarity is critical to obtaining good samples that are suitable for use in cryo-EM imaging and analysis.

Conventional vitrification processes rely on trial and error to achieve an acceptable sample. Typically, several cryo-EM samples are prepared on EM grids under a variety of conditions, with the hope that one of those conditions will produce a vitrified sample having the desired ice thickness and clarity. With reference to FIGS. 1-3, there is illustrated an example of a conventional EM grid 100 that may be used to suspend biological samples. Grid 100 includes a flat disk 102, which is provided with an array of grid openings 104 that are formed by intersecting metallic rails 106. These rails 106 are made from a material having high thermal conductivity such as copper, nickel, aluminum, etc. A single grid opening 104' is highlighted in FIG. 1 and is enlarged in FIG. 2. A film 108, sometimes called a holey carbon film, is placed on top of and is adhered to the disk 102 and covers the grid openings 104. The film 108 is provided with an array of very small holes 110 that extend through the film and across the entire surface of the disc 102.

These grids 100 are commonly used in a conventional sample preparation method known as the blotting and plunge freezing method, which can be done manually or semi-automatically with devices currently on the market. In preparing a sample for cryo-EM imaging and analysis, a droplet of a sample material is often deposited onto the film by hand using a pipette. A cross section of two of the holes 110 of grid opening 104' is shown in FIG. 3. As seen there, the sample solution 112 fills the holes 110 but a large amount of the solution collects on top of the film 108. At the blotting step, filter paper is brought into contact with the sample solution 112 and a portion of the sample solution is absorbed into the filter paper. The left hole 110 shown in FIG. 3 shows the sample solution 112 before the filter paper is used. The right hole 110 shown in FIG. 3 shows the sample solution 112 after a portion of the sample solution 112 has been removed from the grid 102 at the blotting step. The grid 100 is then vitrified by plunge freezing into a cryogen, such as liquid ethane, liquid propane, or a mixture of the two cooled by liquid nitrogen.

FIGS. 4-6 are enlarged side views of the right hole 110 shown in FIG. 3 under three different scenarios. In each case, sample solution 112 is held in the hole 110 by surface tension (i.e., capillary action) and a meniscus having a peak 114 formed at the center of the layer of sample solution on both the top and bottom of the layer of sample solution. The vertical distance between these peaks 114 defines a height H of the ice layer. In FIG. 4, too much sample solution 112 was left remaining at the blotting stage, which resulted in a vitreous ice layer having a thickness H that is too great. This is evidenced by the stacking of proteins 116 on the left-hand side and the dissociated protein shown on the right-hand side. In FIG. 5, an insufficient amount of sample solution 112 was left at the blotting stage, which resulted in an ice layer having a thickness H that is too small. This is evidenced by the exposure of the proteins 116, which extend through the water-air interface 118. In FIG. 6, an ideal amount of sample solution 112 was left at the blotting stage, which resulted in an ice layer having an ideal thickness H. This is evidenced by proteins 116 that are fully encapsulated by the ice layer and are well-dispersed throughout. Ideally, proteins 116 are homogeneous and well-dispersed in a single layer across throughout the vitreous ice layer and adopt random orientations. These random orientations allow the proteins to be viewed from multiple angles in a single view, enabling the three-dimensional structural reconstruction at a later step.

As shown above, the conventional blotting and plunge freezing method is unreliable, labor intensive, and slow. Each stage of sample preparation, namely pipetting, blotting, and plunge freezing, is carried out sequentially or by hand. The actual amount of time separating each of these steps may be only seconds, but it is long enough for the samples to be adversely impacted as molecules tumble around in solution. For example, when sample solutions are initially deposited onto a grid, they may have well-dispersed and randomly-oriented individual proteins. However, while the blotting occurs and before the plunge freezing step, those proteins may coalesce, disperse, readjust their configurations in solution, and adopt a preferential alignment (i.e., proteins align themselves in a particular manner and are not randomly oriented). Each of these behaviors negatively impacts the sample and makes EM imaging and the determination of protein structures more difficult.

Another major drawback to this conventional process is the cost associated with waste sample material. Generally, a 2-4 µl sample volume is required to prepare a single sample grid 100. However, 99.9% of the sample volume is lost during grid preparation. Much of this loss occurs at the blotting stage of sample preparation, but evaporation is also a cause of loss of the sample solution. Sample solutions are often difficult and expensive to obtain due to extensive work in synthesis, extraction, and purification, etc. For that reason, attempts have been made to reduce these losses. For example, samples are sometimes prepared in an environment having a high humidity level, such as in an enclosed chamber, such that sample loss due to evaporation is minimized or eliminated. However, as explained above, EM imaging occurs in a vacuum. For that reason, it has been impossible to prepare a sample using the conventional blotting and plunge freezing method and then image that sample in the same environment.

Therefore, what is needed, is an improved method and apparatus for preparing biological samples for cryo-EM imaging and analysis.

NOTES ON CONSTRUCTION

The use of the terms "a", "an", "the" and similar terms in the context of describing the invention are to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. The terms "substantially", "generally" and other words of degree are relative modifiers intended to indicate permissible variation from the characteristic so modified. The use of such terms in describing a physical or functional characteristic of the invention is not intended to limit such characteristic to the absolute value which the term modifies, but rather to provide an approximation of the value of such physical or functional characteristic.

Terms concerning attachments, coupling and the like, such as "connected" and "interconnected", refer to a relationship wherein structures are secured or attached to one another either directly or indirectly through intervening structures, as well as both moveable and rigid attachments or relationships, unless specified herein or clearly indicated by context. The term "operatively connected" is such an attachment, coupling or connection that allows the pertinent structures to operate as intended by virtue of that relationship.

The use of any and all examples or exemplary language (e.g., "such as" and "preferably") herein is intended merely to better illuminate the invention and the preferred embodiment thereof, and not to place a limitation on the scope of the invention. Nothing in the specification should be construed as indicating any element as essential to the practice of the invention unless so stated with specificity.

BRIEF SUMMARY OF THE INVENTION

The above and other needs are met by an electron microscope (EM) preparation and imaging system that includes an EM device and a sample preparation apparatus for forming a vitreous ice layer containing liquid (e.g., biological) samples through vitrification that may both be optionally placed into a sealable environment. The sample preparation apparatus includes a cryogenically-cooled stage that is configured to removably receive a sample deposit surface such that the deposit surface is cryogenically cooled through direct contact with the stage. The sample preparation apparatus further includes a sample dispenser that is at least one of laterally, longitudinally, vertically, or rotationally movable with respect to the stage. The sample dispenser is configured to deposit a liquid sample onto the sample deposit surface at a selected rate of deposition. Once the liquid sample is deposited onto the sample deposit surface by the sample dispenser, it is vitrified automatically in place. The sealable environment is configured to be placed under at least one of a positive pressure or a negative pressure. At least a portion of the EM device and sample preparation apparatus is located inside the sealable environment such that a sample may be vitrified by the sample preparation device and imaged by the EM device inside of and without being removed from the sealable environment and without changing the pressure of sealable environment.

In order to facilitate an understanding of the invention, the preferred embodiments of the invention, as well as the best mode known by the inventor for carrying out the invention, are illustrated in the drawings, and a detailed description thereof follows. It is not intended, however, that the invention be limited to the particular embodiments described or to use in connection with the apparatus illustrated herein. Therefore, the scope of the invention contemplated by the inventor includes all equivalents of the subject matter described herein, as well as various modifications and alternative embodiments such as would ordinarily occur to one skilled in the art to which the invention relates. The inventor expects skilled artisans to employ such variations as seem to them appropriate, including the practice of the invention otherwise than as specifically described herein. In addition, any combination of the elements and components of the invention described herein in any possible variation is encompassed by the invention, unless otherwise indicated herein or clearly excluded by context.

BRIEF DESCRIPTION OF THE DRAWINGS

The presently preferred embodiments of the invention are illustrated in the accompanying drawings, in which like reference numerals represent like parts throughout, and in which:

FIG. 1 is a plan view depicting a sample grid that has been conventionally used in connection with electron microscopy;

FIG. 2 is a plan view depicting a single grid opening of the grid of FIG. 1;

FIG. 3 is a partial sectional view of the grid of FIG. 2, shown along line 3-3;

FIG. 7 is a perspective view depicting an EM sample preparation apparatus according to an embodiment of the present invention;

FIGS. 8 and 9 are side and front elevation views depicting the EM sample preparation apparatus of FIG. 7, respectively;

FIG. 12 is a plan view illustrating a multi-sample grid according to an embodiment of the present invention;

FIG. 13 is a perspective view depicting an EM sample preparation apparatus according to an alternative embodiment of the present invention;

FIG. 14 is a top plan view depicting a nanometer-scale deposit of liquid sample deposited onto a sample deposit surface of the apparatus of FIG. 13.

DETAILED DESCRIPTION OF THE INVENTION

Figure 4:
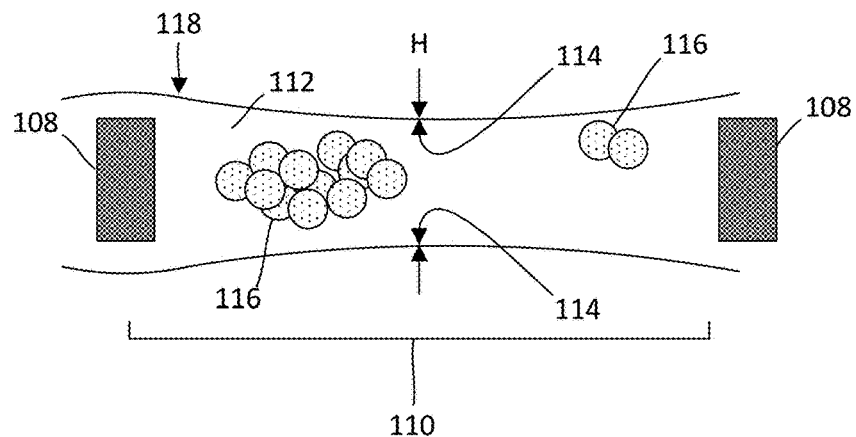
FIGS. 4-6 are detail views of the boxed portion of FIG. 3 that depict a vitreous ice layer that is too thick, too thin, and is ideal, respectively.
Figure 5:
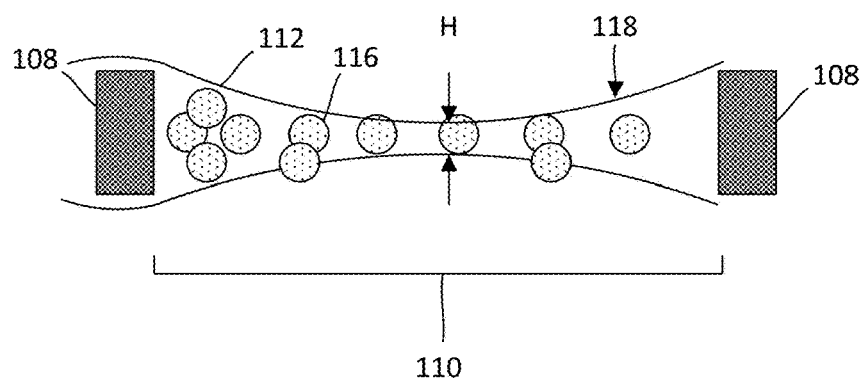
Figure 6:
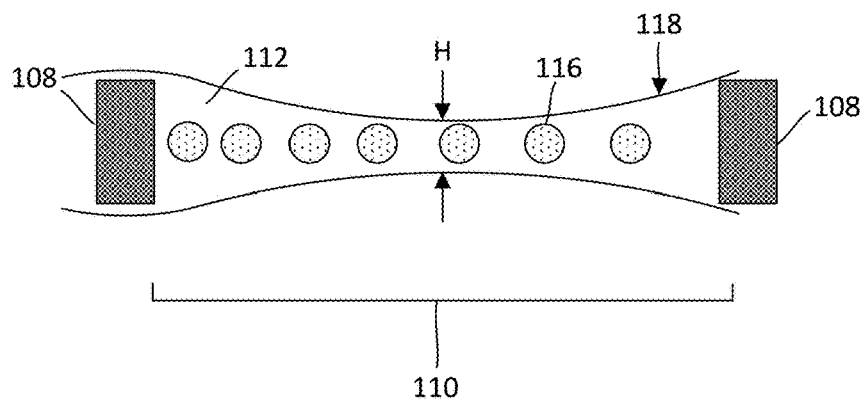

This description of the preferred embodiments of the invention is intended to be read in connection with the accompanying drawings, which are to be considered part of the entire written description of this invention. The drawings are not necessarily to scale, and certain features of the invention may be shown exaggerated in scale or in somewhat schematic form in the interest of clarity and conciseness.

With reference now to FIG. 7, there is provided an EM sample preparation apparatus 200 that includes a cryogenically-cooled stage 202 and a sample dispenser 204 for dispensing a liquid sample onto the stage according to an embodiment of the present invention. The sample dispenser 204 is movable and rotatable with respect to the stage 202. A cryogen loop, including an inlet 206 and an outlet 208, circulates a cryogen, such as liquid ethane, helium or nitrogen, through the stage 202 in order to cool it to cryogenic temperatures (i.e. from absolute zero up to sub-135 Kelvin). In this case, the stage 202 is formed as a stationary metallic block having a low heat capacity and high thermal conductivity (e.g., copper, aluminum, etc.), which supports a fast time scale of vitrification.

In preparing a cryo-EM sample with apparatus 200, a liquid sample solution 210 may be deposited onto a sample deposit surface 212, which is preferably removably positioned on top of the stage 202. Preferably and advantageously, the sample deposit surface 212 utilized with apparatus 200 can be a conventional sample grid, such as the grid 100 that is shown in FIG. 1. This could include, for example, current commercially-available grids made from materials such as holey carbon, holey gold, or other materials with a high thermal conductivity, such as C-flat™ and Quantifoil® brand grids. As such, the term "grid" may also be used interchangeably to refer to sample deposit surface 212.

Advantageously, using this apparatus 200, the liquid sample 210 deposited onto the stage 202 (or a grid 212 in this case) is vitrified automatically and almost immediately in place. (i.e., the liquid sample may be deposited and then vitrified in the same position on the stage without being moved). For example, in certain embodiments, vitrification of the sample solution 210 occurs within one microsecond after contacting stage 202 or the grid 212. By minimizing the time between deposition and vitrification, many of the adverse and unwanted effects, such as proteins becoming dissociated, unfolded, or moving to the water-air interface can be avoided. The type of cryogen selected to cool the stage 202 may vary depending on the type of liquid sample that is being vitrified. For example, liquid nitrogen boils at around 77 K, and may be used to vitrify any liquids that vitrify above that temperature. On the other hand, for liquids that vitrify below 77 K, a different cryogen, such as liquid helium, which boils at around 4 K, may be used as the cryogen.

Preferably, sample dispenser 204 is movable side-to-side along a lateral axis AL, movable front-to-back along a longitudinal axis AT, and movable vertically along a vertical axis AV with respect to the stage 202 and grid 212. For example, in this particular non-limiting embodiment, relative movement of up to ±6 inches is permitted along the AL and AT axes and up to 6 inches is permitted along the AV axis. Either the stage 202, the sample dispenser 204, or both may be moved with respect to the other in the manner discussed above. The presence of the cryogen loop in the stage 202 makes moving the stage more difficult and, therefore, it is preferable that only the sample dispenser 204 is moved. These degrees of freedom enable the sample dispenser 204 to deposit liquid sample 210 at any location across the stage 202 and grid 212. Additionally, sample dispenser 204 is rotatable about at least the lateral axis AL by an angle α (as shown in FIG. 8) and may also be rotatable about the longitudinal axis AT or vertical axis AV. Preferably, sample dispenser 204 may be rotated freely about any of the above-described axes up to 360°. The sample dispenser 204 is configured to deposit the liquid sample solution 210 onto the grid 212 at a selected rate of deposition. In certain cases, the rate of deposition is in the range of 150-350 µL/min. Liquid sample solution 210 may include samples of many types, including biological macromolecules including but not limited to soluble and membrane proteins, protein complexes, nucleic acids, and lipid bilayers; nanomaterials; protein nanocrystals; cellular and subcellular components and soft tissues; etc. The liquid sample solution 210 may also include other types of solutions, including high viscosity solutions, such as liposomes, ionic liquids, and solubilized membrane proteins. Thus, the actual rate of deposition may change based on a number of factors, including the viscosity and viscosity index of the liquid sample solution 210. Viscosity is a material property which describes the resistance of a fluid to shearing flows. The factors that affect viscosity include intermolecular forces, temperature, and the shape of the molecules. Since apparatus 200 works with both liquids and gases at low temperature, sample viscosity is expected to be an important property and parameter to consider. On the other hand, viscosity index (VI) is an arbitrary, unitless measure of the change of viscosity with temperature. In general, the greater the VI, the smaller the change in fluid viscosity for a given change in temperature. In this case, the ideal samples or sample solutions should be ones with the highest VI for they will remain stable and not vary much in viscosity during the sudden drop in temperature in the deposition and vitrification step. For example, the viscosity of the liquid sample solution 210 may range from 0 Pa·s to 2.758×107 Pa·s. Lastly, the rate of movement of the sample dispenser 204 with respect to the stage 202 may be adjusted. The above-described parameters, namely relative movement and rotation of the stage 202 to the sample dispenser 204, the speed of that movement, and the rate of deposition, in combination, enable apparatus 200 to form an ice layer having a precisely-controlled thickness that can be customized by modifying these parameters.

Preferably, the grid 212 is in thermal contact with the stage 202 and both are pre-cooled to cryogenic temperatures by the cryogen loop before liquid sample solution 210 is deposited from sample dispenser 204. Thus, as the liquid sample solution 210 is deposited onto the grid 212, it is immediately vitrified in place (i.e., without being removed from the stage 202) to form an ice layer having a precisely-controlled thickness without requiring the removal of excess sample solution from the sample deposit surface (e.g. blotting) and without requiring moving the grid from a sample solution deposition location to another location for plunge freezing. Thus, apparatus 200 and the related method of use provide superior cryo-EM sample grids more efficiently, quickly and consistently with less material and time than was possible using conventional apparatuses and methods, including particularly the blotting followed by plunge freezing method discussed above.

Figure 10:
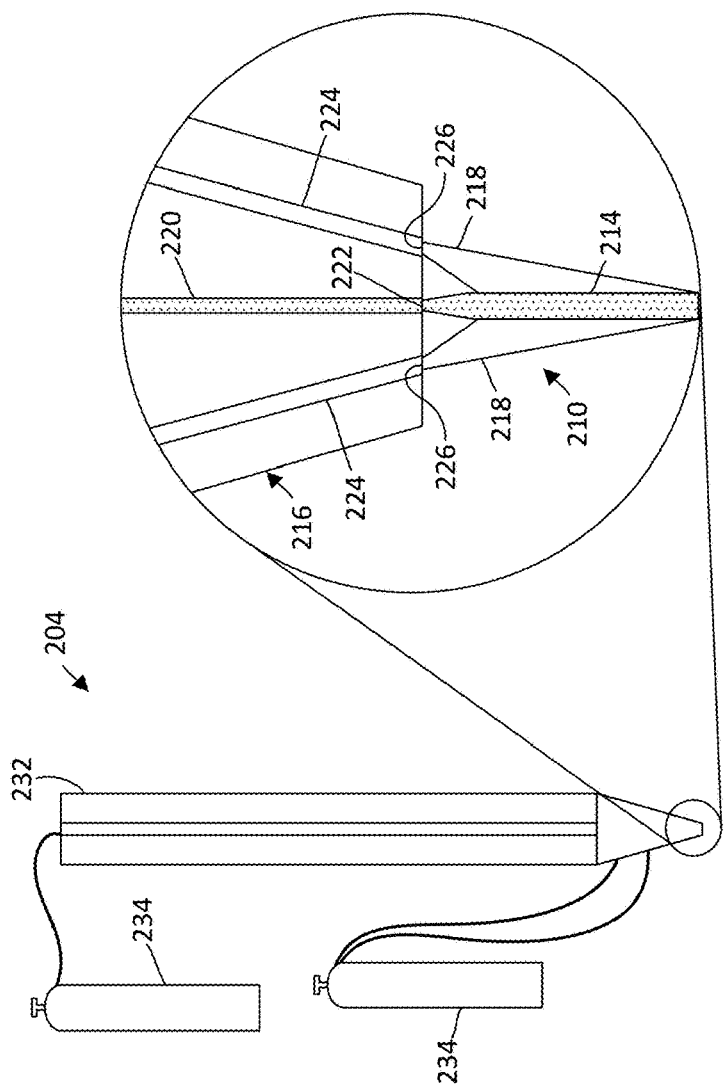
FIG. 10 is a detail view of a sample dispenser having a reservoir and nozzle according to an embodiment of the present invention.

With continued reference to FIG. 7 and with further reference to FIG. 10, in this particular embodiment, the sample dispenser 204 is configured to form a microfluidic jet of sample solution 210 that is comprised of a first liquid sample 214 that is flattened into a sheet. In this particular embodiment, sample dispenser 204 includes a sheet nozzle 216 that flattens the first liquid sample 214 into a sheet by directing gas jets 218 towards opposing sides of the jet of first liquid sample. In some embodiments, this sheet can be as thin as 1 nm. Preferably, gas jets 218 are formed using a non-reacting gas such as nitrogen or argon. Nozzle 216 includes a first liquid channel 220 for carrying the first liquid sample 214 and an aperture 222 for forming jet of first liquid sample 214 and separate gas channels 224 for carrying the non-reactive gas and separate apertures 226 for forming gas jets 218. Preferably, channels 224, nozzles 226, or both are angled with respect to channel 220, nozzle 222, both such that gas jets 218 are directed symmetrically towards opposing sides of the jet of first liquid sample 214. In other embodiments, nozzle 216 is configured to steer and mix the liquid sample solution 210 or the individual components thereof prior to forming the sheet shown in FIG. 7.

Figure 11:
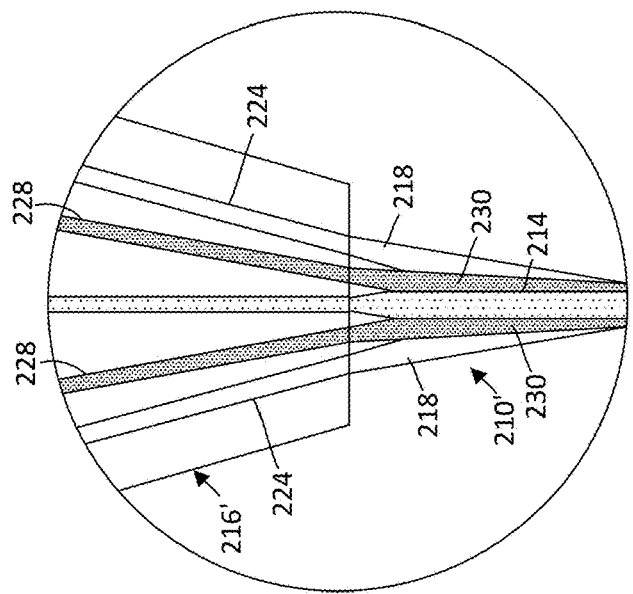
FIG. 11 is a second detail view of the sample dispenser shown in FIG. 10 having a reservoir and nozzle according to an alternative embodiment of the present invention.

With reference to FIG. 11, in certain embodiments, an alternative nozzle 216' is almost structurally and functionally identical to nozzle 216 and includes first liquid channel 220 and gas channels 224. However, nozzle 216' also includes one or more auxiliary or second liquid channels 228, each with a nozzle, for carrying other liquid samples. The liquid sample carried by second liquid channels 228 may be identical to first liquid sample 214. However, in other embodiments, a second, different liquid sample 230 is carried through second liquid channels 228. Preferably, the jets of first and second liquid samples 214, 230 are formed between the jets of non-reacting gas 218, such that the jets of non-reacting gas flatten the jets of first and second liquid samples into a single sheet of sample solution 210' that is comprised of the first and second liquid samples. In still other embodiments, additional channels may be provided to combine and mix even more liquid samples together.

Referring again to FIG. 10, in preferred embodiments, sample dispenser 204 includes one or more biocompatible reservoirs 232 that each holds a quantity of liquid sample (e.g., liquid sample 214, 230). These reservoirs 232 are in fluid communication with a liquid channel 220, 228 that has been designated for that particular liquid sample. In the illustrated embodiment, reservoir 232 is formed as an integral part of sample dispenser 204 that is in direct contact with nozzle 216. However, in other embodiments, reservoir 232 is remote from nozzle 216 of sample dispenser 204, which are connected together by microfluidic connectors, tubing or capillaries. The microfluidic connectors can have "n" number of ports or liquid channels, where "n" is any number greater than zero. Whichever number of channels used in a study depends on the particular experimental needs of the users; namely, however many chemical components and/or species are being investigated in a sample mixture and thus however many sample reservoirs 232 are needed to be connected in parallel to the microfluidic dispenser 204 through a microfluidic connector. In each case, a pressurizing force acts on the liquid sample so that the liquid sample flows from the reservoir 232 through the liquid channel 220, 228 and out of the appropriate nozzle 222. This pressure may be created, for example, manually, by a pump, a pressurized gas supply (e.g., non-reactive gas 218), high performance liquid chromatography (HPLC), etc. In this case, separate supplies 234 of pressurized gas are connected to the sample dispenser 204. One of the supplies 234 of gas provides pressure within sample dispenser 204 to push liquid sample from reservoir 232 and out of nozzle 216. The second supply 234 of gas provides gas jets 218. In this particular embodiment, nozzle 216 is formed using glass that can safely withstand pressures of up to 4000 psi. Similarly, in this particular embodiment, fluid lines, including those in and connected between the reservoir 232 and sample dispenser 204 can safely withstand internal pressure of up to 4000 psi. However, in other embodiments, components of apparatus 200 may be formed using other materials (e.g., metals, etc.), which can safely withstand even higher internal pressures. In general, the components of apparatus 200 are preferably formed using biocompatible materials, such as 316 stainless steel, polyether ether ketone (PEEK), silica, etc. This ensures and protects the chemical, biological, and physical integrity of the apparatus 200 as well as the stability of the samples used.

Using apparatus 200, cryo-EM grids having an ice layer having a consistent and controllable thickness may be quickly and repeatedly created. The thickness of the ice layer may be adjusted by adjusting one or more of the following parameter: (i) the relative positioning and angle of the stage 202 and sample dispenser 204; (ii) the speed of relative movement between the stage and sample dispenser; and (iii) the flow rate of sample solution from the sample dispenser. As shown in FIG. 7, apparatus 200 can be used to simultaneously create several grids 212. Additionally, as shown in FIG. 12, apparatus 200 can form separate deposits 236 of the same sample solution 210 or of different sample solutions on a single grid 212. The arrows show the direction of relative movement of the sample dispenser (not shown) with respect to the grid 212. Producing a multi-sample grid 210 would, for example, eliminate the need to prepare a separate grid for each sample when multiple samples need to be tested, measured, examined, screened, etc. Since grid 212 is cryogenically pre-cooled, deposits 236 are vitrified in place and almost immediately upon contact. No additional time or processing steps, such as blotting and plunge freezing, are required after sample deposition. As such, formation of the vitrified ice layers using apparatus 200 are much faster, more predictable, and less labor intensive than conventional methods. After the ice layers have been formed, the grid 212 may be removed from the apparatus 200 and transferred, according to standard cryogenic sample handling procedures, to an EM or other device for imaging and analysis.

With reference now to FIG. 13, there is provided an EM sample preparation apparatus 300 that includes a rotating cryogenically-cooled stage 302 and a sample dispenser 304 according to an alternative embodiment of the present invention. Sample dispenser 304 is movable side-to-side along a lateral axis AL, movable front-to-back along a longitudinal axis AT, and movable vertically along a vertical axis AV with respect to the stage 302. For example, in this particular non-limiting embodiment, relative movement of up to ±6 inches is permitted along the AL and AT axes and up to 6 inches is permitted along the AV axis. Either the stage 302, the sample dispenser 304, or both may be moved with respect to the other in the manner discussed above.

The cryogenically-cooled stage 302 includes a stationary bottom portion 306 and a rotatable top portion 308 that is rotatable with respect to the bottom portion about AV axis. Bottom portion 306 may include a cryogenically-cooled motor (not shown) for rotating top portion 308. The top portion 308 preferably includes two or more placement sites 310 that accept and securely hold a sample deposit surface (also referred to herein as a "grid"). For example, each placement site 310 may be slightly indented below a top surface of the top portion 308 in order to provide recessed area that is sized for the grid. In FIG. 13, one sample deposit surface 312A is centrally located at the center of rotation along axis AV. Another sample deposit surface 312B is located at one of several placement sites 310 along the periphery of the top portion 308 of the stage 302. The sample dispenser 304 includes a capillary tube, microfluidic droplet dispenser, etc. that is configured to deposit nanometer-scale deposits 314 of said liquid sample onto the stage 302. Advantageously, the placement sites 310 may be positioned proximate the sample dispenser 304 by rotating the rotatable top portion 308 with respect to the stationary bottom portion 306 such that liquid sample may be dropped from the capillary tube 304 onto each of the placement sites 310, including on the grid 312 positioned there, in an identical manner without moving the sample dispenser. Alternatively, a bottom end 324 of the capillary tube may be lightly touched to the rotating grid to dispense sample solution onto the grid.

A cryogen loop, including an inlet 316 and an outlet 318, circulates a cryogen through the rotatable stage 302 in order to cool the stage down to cryogenic temperatures. Thus, once drop 314 of sample solution contacts the stage 302 or a grid 312 placed on the stage, the sample vitrifies almost immediately to form an ice layer. The relative position of the stage 302 and sample dispenser 304 as well as the rotational speed of the stage may be used to adjust the thickness of the ice layer that is formed. In this particular case, top portion 308 can be rotated up to 50,000 revolutions per minute with respect to bottom portion 306. With reference to FIG. 14, there is provided an overhead view of a grid 312 that is located at the center of rotation of the top portion 306 (i.e., centered on axis Av) and showing a drop 314 of liquid sample having an initial periphery 320. The drop 314 preferably spreads evenly and uniformly across grid 312 in a direction that is orthogonal to the axis Av to a final periphery 322. On the other hand, drops falling onto grids 312 located on the periphery of the top portion 306, such as drop 314', will spread across the surface of the grid in a non-uniform, linear manner away from the center of rotation of the top portion due to the centrifugal force caused by the rotation of the top portion. Preferably, drops 314, 314' vitrify on the grids 312 immediately after being spread in the manner discussed above.

Figure 15:
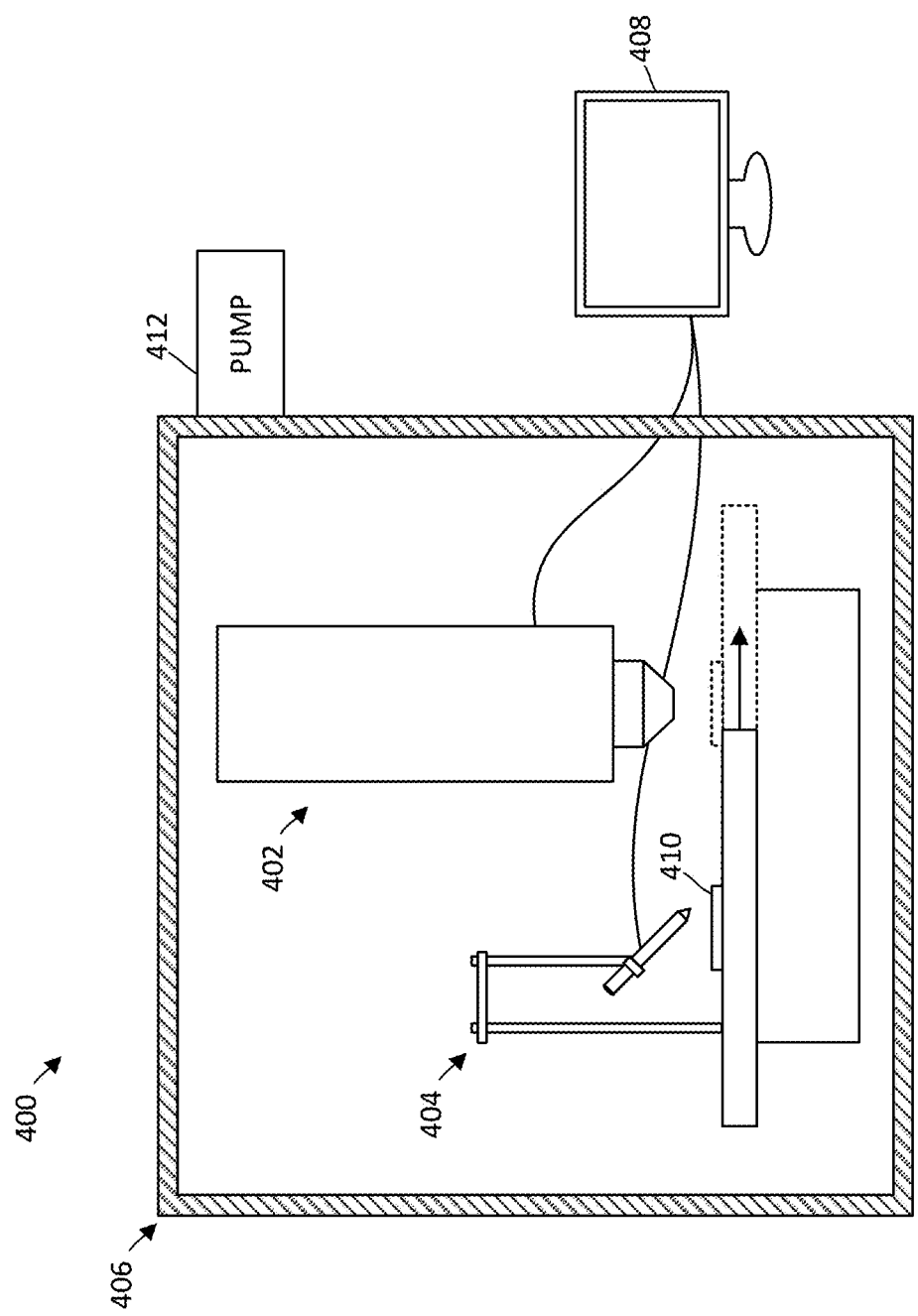
FIG. 15 is an elevation view depicting an EM preparation and imaging system according to an embodiment of the present invention, namely a fully integrated cryo-EM sample preparation and electron microscopy system.

Lastly, with reference to FIG. 15, there is provided an electron microscope preparation and imaging system 400 according to an embodiment of the present invention. System 400 includes an EM device 402, such as a transmission electron microscope, and a sample preparation apparatus 404, such as apparatus 200 (shown in FIG. 7) or apparatus 300 (shown in FIG. 13), which may both be optionally located in a sealable environment 406. System 400 also includes a workstation 408 for controlling the EM device 402 and sample preparation apparatus 404 that is located outside of the sealable environment 406.

Sealable environment 406 can be placed under at least one of a positive pressure or a negative pressure, such that a sample grid 410 may be prepared (including both the deposition and vitrification steps), imaged, and analyzed by the sample preparation device 404 and EM device 402 entirely inside of the sealable environment. A pump apparatus 412 may be provided to create the positive and negative pressure with the sealable environment 406. In addition to a vacuum, vitrification can occur in a variety of positive pressure atmospheres, including water-free air (e.g., humidity level less than 10%), backfilled with hydrophilic gas (e.g., sulfur dioxide), backfilled with hydrophobic gas (e.g., nitrogen), backfilled with noble gases (e.g., argon), or other water-less atmospheres. During the preparation, imaging and analysis processes, sample grid 410 can remain within the sealable environment and the internal atmosphere of the seal environment can remain unchanged. Additionally, no direct human interaction or handling is required in preparing, transferring, or imaging of the grid 410. For example, the sealable environment may be maintained at a positive, negative, or neutral pressure relative to the environment outside the sealable environment.

After the vitreous ice layer has been formed using the above-described devices, the thickness of that ice layer can be measured according to several methods. One method that may be used to measure the thickness of the ice layer is ellipsometry, which is an analytical technique that utilizes thin-film interference to measure properties of thin films, including their thickness, at cryogenic temperatures. In a typical ellipsometry experiment, polarized light is reflected off a film surface to create a spectrum of colored bands. From this, the thickness of the ice layer can be determined based on an analysis of those color bands.

Although this description contains many specifics, these should not be construed as limiting the scope of the invention but as merely providing illustrations of some of the presently preferred embodiments thereof, as well as the best mode contemplated by the inventor of carrying out the invention. The invention, as described and claimed herein, is susceptible to various modifications and adaptations as would be appreciated by those having ordinary skill in the art to which the invention relates.

What is claimed is:

1. An electron microscopy (EM) sample preparation apparatus comprising:
    a cryogenically-cooled stage; and
    a sample dispenser that is movable and rotatable with respect to the stage and that is configured to deposit, at a selected rate of deposition, a liquid sample onto the stage,
    wherein the liquid sample deposited onto the stage by the sample dispenser is vitrified automatically and immediately in place with a user-defined vitreous ice thickness.

2. The apparatus of claim 1 wherein the sample dispenser is movable with respect to the stage along a lateral axis, a longitudinal axis and a vertical axis; and wherein the sample dispenser is rotatable with respect to the stage.

3. The apparatus of claim 1 wherein the sample dispenser comprises a capillary tube configured to deposit nanometer-scale deposits of said liquid sample onto the stage.

4. The apparatus of claim 1 wherein the cryogenically-cooled stage comprises a stationary bottom portion and a rotatable top portion that is rotatable with respect to the bottom portion, the top portion having two or more placement sites wherein each of the placement sites may be positioned proximate the sample dispenser by rotating the rotatable top portion with respect to the stationary bottom portion such that liquid sample may be deposited from the sample dispenser onto each of the placement sites in an identical manner without moving the sample dispenser.

5. The apparatus of claim 1 wherein the sample dispenser is configured to form a microfluidic jet comprising a jet of a first liquid sample that is flattened into a sheet.

6. The apparatus of claim 5 further comprising two jets of non-reacting gas directed towards opposing sides of the jet of first liquid sample in order to flatten the jet of first liquid sample into said sheet.

7. The apparatus of claim 5 further comprising a nozzle having a first liquid channel for carrying the first liquid sample and separate gas channels for carrying a non-reacting gas, wherein the jet of first liquid sample and jets of non-reacting gas are formed by separate apertures disposed at a tip of the nozzle, and wherein the gas channels are configured to direct separate jets of non-reacting gas towards opposing sides of the jet of first liquid sample in order to flatten the jet of first liquid sample into said sheet.

8. The apparatus of claim 7 wherein the nozzle further comprises a second liquid channel for carrying a second liquid sample that is formed into a jet by an aperture disposed at the tip of the nozzle, wherein the jets of first and second liquid samples are formed between the jets of non-reacting gas, such that the jets of non-reacting gas flatten the jets of first and second liquid samples into a single sheet that is comprised of the first and second liquid samples.

9. The apparatus of claim 5 further comprising a biocompatible reservoir configured to hold a quantity of liquid sample, the reservoir in fluid communication with the nozzle and configured such that liquid sample in the reservoir may be carried to and dispersed by the nozzle under pressure.

10. The apparatus of claim 1 further comprising a sample deposit surface removably disposed on and in thermal contact with the stage such that the deposit surface is cooled by the stage and such that liquid sample deposited from the sample dispenser onto the sample deposit surface is vitrified automatically and immediately in place.

11. A method for preparing cryogenic electron microscopy samples comprising the steps of:
    A. providing a sample preparation device having: a cryogenically-cooled stage and a sample dispenser;
    B. defining a user-defined ice thickness; and
    C. depositing a liquid sample onto the stage using the sample dispenser to form a vitrified sample having a vitreous ice layer of said user-defined ice thickness.

12. The method of claim 11 further comprising the step of cryogenically pre-cooling the stage prior to Step (B).

13. The method of claim 11 further comprising providing a vacuum environment, wherein the liquid sample is deposited and vitrified in the vacuum environment.

14. The method of claim 13 further comprising the steps of: providing an electron microscope within the vacuum environment; and imaging the vitrified sample using the electron microscope.

15. The method of claim 11 further comprising the steps of depositing the liquid sample in a droplet form onto the stage; and rotating the stage about a rotational axis such that the liquid sample is dispersed across the stage in a direction orthogonal to the rotational axis as the liquid sample vitrifies.

16. The method of claim 11 further comprising the step of moving the sample dispenser in a lateral direction, longitudinal direction or vertical direction with respect to the stage.

17. The method of claim 11 further comprising the step of rotating the sample dispenser with respect to the stage.

18. The method of claim 11 further comprising depositing a first liquid sample onto a first portion of the stage using the sample dispenser and depositing a second liquid sample onto a second and different portion of the stage using the sample dispenser.

19. The method of claim 11 further comprising providing a sample deposit surface removably disposed on and in thermal contact with the stage, such that the deposit surface is cooled by the stage and such that liquid sample deposited from the sample dispenser onto the stage the sample deposit surface is vitrified automatically and immediately in place.

20. An electron microscope (EM) preparation and imaging system comprising:
    an EM device; and
    a sample preparation apparatus for forming a vitreous ice layer containing a liquid sample through vitrification, the apparatus comprising:
        a cryogenically-cooled stage configured to removably receive a sample deposit surface such that the deposit surface is cryogenically cooled through direct contact with the stage;
        a sample dispenser that is at least one of laterally, longitudinally, vertically, or rotationally movable with respect to the stage and that is configured to deposit a liquid sample onto the sample deposit surface at a selected rate of deposition, wherein, once the liquid sample is deposited onto the sample deposit surface by the sample dispenser, it is vitrified automatically in place; and a sealable environment configured to be placed under at least one of a positive pressure or a negative pressure, wherein at least a portion of the EM device and sample preparation apparatus is located inside the sealable environment such that a sample may be vitrified by the sample preparation device and imaged by the EM device inside of and without being removed from the sealable environment and without changing the pressure of sealable environment.

\* \* \* \* \*